(12) United States Patent
Chen

(10) Patent No.: US 6,815,367 B2
(45) Date of Patent: Nov. 9, 2004

(54) ELIMINATION OF RESIST FOOTING ON TERA HARDMASK

(75) Inventor: Xiaochun Linda Chen, Hopewell Junction, NY (US)

(73) Assignee: Infineon Technologies AG, Munich (DE)

(*) Notice: Subject to any disclaimer, the term of this patent is extended or adjusted under 35 U.S.C. 154(b) by 26 days.

(21) Appl. No.: 10/114,484

(22) Filed: Apr. 3, 2002

(65) Prior Publication Data

US 2003/0190811 A1 Oct. 9, 2003

(51) Int. Cl.⁷ .............................................. H01L 21/302
(52) U.S. Cl. ...................... 438/736; 438/761; 257/635
(58) Field of Search ............................. 216/12, 47, 49; 438/717, 736, 737, 738, 761–763, 770, 787, 950, 952

(56) References Cited

U.S. PATENT DOCUMENTS

| | | | |
|---|---|---|---|
| 5,830,605 A | 11/1998 | Umeki et al. | |
| 5,886,102 A | 3/1999 | Sinta et al. | |
| 6,159,863 A | 12/2000 | Chen et al. ................. | 438/720 |
| 6,261,743 B1 | 7/2001 | Pavelchek et al. .......... | 430/325 |
| 6,300,240 B1 | 10/2001 | Linliu et al. | |
| 6,303,275 B1 | 10/2001 | Coles et al. | |
| 6,329,117 B1 | 12/2001 | Padmanaban et al. | |
| 6,518,200 B2 * | 2/2003 | Lin ............................. | 438/761 |
| 6,573,189 B1 * | 6/2003 | Lin et al. .................... | 438/725 |

* cited by examiner

*Primary Examiner*—Wael Fahmy
*Assistant Examiner*—Ginette Peralta

(57) ABSTRACT

A process of eliminating resist footing on a hardmask when preparing a semiconductor wafer stack, comprising:
  a) depositing a layer of hardmask material on a substrate;
  b) subjecting the hardmask to oxygen under conditions sufficient to produce an oxide cap layer and provide a hardmask/oxide cap layer with a substrate reflectivity below 0.8%;
  c) forming a layer of $SiO_2$ on the hardmask/oxide cap layer;
  d) forming a layer of photoresist on the layer of $SiO_2$;
  e) patterning and developing the layer of photoresist by exposing photoresist; and
  f) etching exposed portions of the layer of hardmask/oxide cap layer/$SiO_2$ layer to obtain a semiconductor wafer stack with no standing waves and free from resist footing.

21 Claims, 8 Drawing Sheets

ELIMINATION OF RESIST FOOTING ON TERA HARDMASK

BACKGROUND OF THE INVENTION

1. Field of the Invention

The invention relates to a method of manufacturing a wafer stack comprising a deep trench (DT) level, wherein the deposited TERA hardmask has a substrate reflectivity below 0.8 percent, but wherein the resist printed on to wafer is free from creating an interaction between the resist-hardmask, and is therefore free from the disadvantage of "footing".

2. Description of the Related Art

Increased demand for high performance in semiconductor devices has necessitated smaller ground rules, in part, to permit increased processing speed. Consistent with the demand for high performance semiconductor devices, is the corollary of finer and finer patterning of resist images to attain higher integration. To satisfy this requirement, development and improvement of lithographic techniques using short-wave length exposure tools such as deep-ultraviolet (DUV) has been employed.

Photoresists (resists) are photo sensitive films that are used for transfer of an image to a substrate, and entails coating the photoresists on a substrate and exposing it through a photomask to a source of activating radiation. The photomask is comprised of areas that are opaque to activating radiation and other areas that are transparent to activating radiation. The exposure to activating radiation creates a photoinduced chemical transformation of the photoresist coating to transfer a pattern from the photomask to the photoresist coated substrate. After exposure the photoresist is developed to form a relief image that allows selective processing of the substrate.

The photoresist may be either positive-acting or negative-acting. In the negative-acting photoresists coating the layer portions that are exposed to activating radiation crosslinks or polymerizes a reaction between a photoactive compound and polymerizable reagents of the photoresist, so that exposed coating portions are made less soluble in a developer solution than unexposed portions.

For a positive-acting photoresist, exposed portions are made more soluble in a developer solution while areas not exposed are less soluble in the developer solution.

Proper photoresist processing is one of the keys to obtaining a small ground rule, efficient wafer stack for a DT level on the semiconductor.

Unfortunately, at the critical levels required for high performance semiconductor devices where density lines are required to be increased for a wafer stack for a DT level, a single layer resist approach cannot fulfill both the lithography and etch requirements, due to the fact that, even though use of a TERA hardmask produces a substrate reflectivity below 0.8 percent without any standing waves, nevertheless, a resist-hardmask interaction occurs that results in "footing".

Lee et al., *Inorganic ARC for 0.18 μm and Sub-0.18 μm Multilevel Interconnects* 1998 IEEE 98, 84–86 disclose a novel designed inorganic ARC for deep-UV lithography and implementation of the ARC into multi-level metal interconnects for sub-micron technologies using $Si_xO_yN_z$ ARC to reduce substrate reflectivity to a minimum and prevent DUV resist footing, while allowing the novel ARC to serve as a hardmask for metal etch.

In-situ hardmask and metal etch in a single etcher to develop a semiconductor device with a layer of photoresist patterned and developed free from resist footing is disclosed in U.S. Pat. No. 6,159,863. The process entails:

forming active devices in and on a substrate in the semiconductor wafer;

forming an interlayer dielectric on a surface of the semiconductor wafer;

forming a metal layer on the surface of the interlayer dielectric;

forming a layer of hardmask material on the surface of the metal layer;

forming a layer of photoresist on the layer of hardmask material;

patterning and developing the layer of photoresist exposing portions of the hardmask material underlying the layer of photoresist;

placing the semiconductor wafer in an etcher;

etching the exposed portions of the layer of hardmask material exposing portions of the metal layer underlying the layer of hardmask material; and without removing the semiconductor wafer from the etcher etching the exposed portions of the metal layer.

U.S. Pat. No. 6,261,743 B1 disclose a method of forming a photoresist relief image that substantially reduces "notching" and "footing" comprising:

(a) applying on a substrate a layer of an antireflective composition comprising a photoacid generator compound, an acid or thermal acid generator compound and a crosslinker, and crosslinking the antireflective layer;

(b) applying a layer of the photoresist composition over the antireflective composition layer;

(c) exposing the photoresist layer to activating radiation whereby the photoacid generator of the antireflective composition generates acid; and (d) developing the exposed photoresist.

In manufacturing a wafer stack comprising a deep trench (DT) level, in which a hardmask is deposited on a substrate to provide the necessary reflectivity below 0.8%, there is a need to enable a single layer resist (SLR) printed on the wafer, in which there are no standing waves, to also prevent interaction between the resist-hardmask that leads to footing and the drawbacks attendant thereto.

SUMMARY OF THE INVENTION

An object of the present invention is to provide a process to manufacture a wafer stack, wherein the hardmask deposited on the substrate has a reflectivity below about 0.8%, so that a single layer resist (SLR) printed on the wafer shows no standing waves, and prevents interaction between the resist-hardmask, to thereby alleviate "footing" or the failure to clear during development that results in an upwardly tapering release image sidewall.

In general, the invention is accomplished by forming a layer of hardmask material on a photoresist disposed on a substrate; subjecting the hardmask to an oxidation step to form a cap; depositing a layer of $SiO_2$ on top of the cap layer; and patterning and developing the layer of photoresist to obtain a substrate reflectivity below 0.8%, without the occurrence of "standing waves", and without "footing".

BRIEF DESCRIPTION OF THE DRAWING FIGURES

DETAILED DESCRIPTION OF PREFERRED EMBODIMENT OF THE INVENTION

Figure 1:
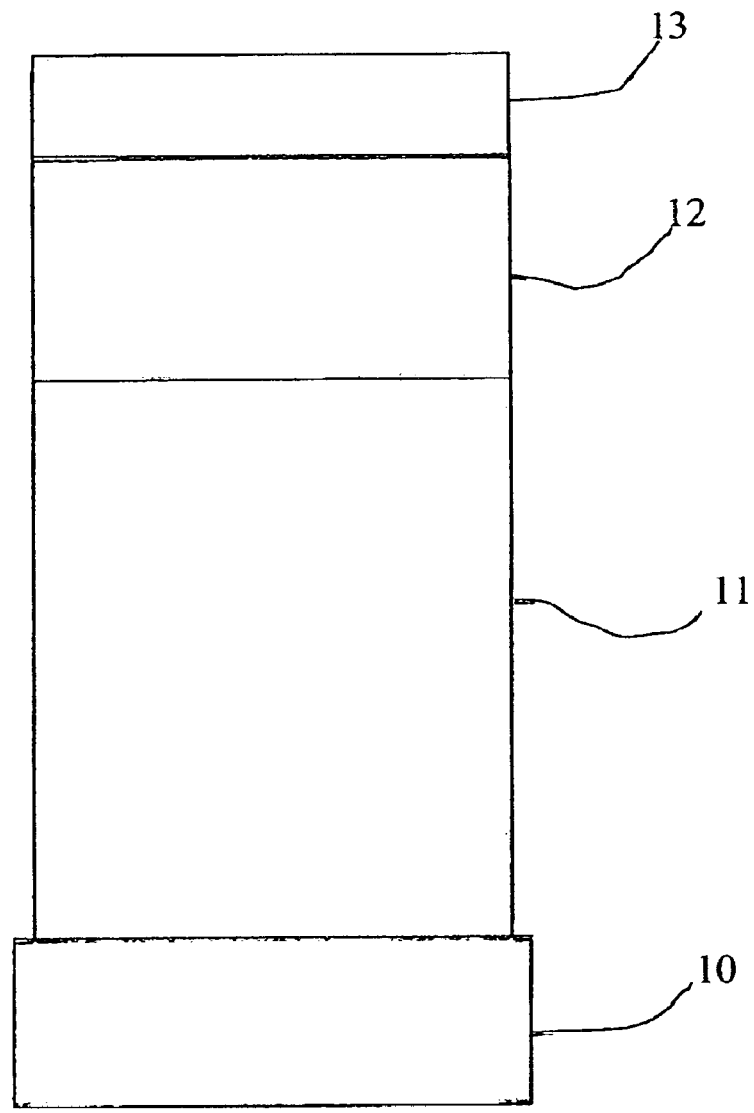
FIG. 1 depicts a prior art wafer stack comprising a DT level, and shows an oxide layer disposed on the hardmask to form a cap layer.

In describing the method for eliminating resist footing on a hardmask in the context of the invention, reference is now made to FIG. 1 which depicts a prior art wafer stack comprising a deep trench level. In this figure, there is shown a substrate of borosilicate glass (BSG) 10 on which there is deposited a hardmask 11. The hardmask is oxidized to form a cap layer 12, upon which a resist layer 13 is deposited. In this figure, the tunable etch resistance ARC (anti reflective coating) hardmask is deposited at a thickness of about 200 nm, whereupon in a subsequent deposition step, an oxygen flow is introduced to provide about a 25 nm+/−5 nm cap layer. This hardmask has a substrate reflectivity below 0.8%, and resist printed on this wafer exhibits no standing waves, however, a resist-hardmask interaction is nevertheless formed, which leads to "footing" or the failure to clear during development that results in an upwardly tapering release image sidewall.

Figure 2:
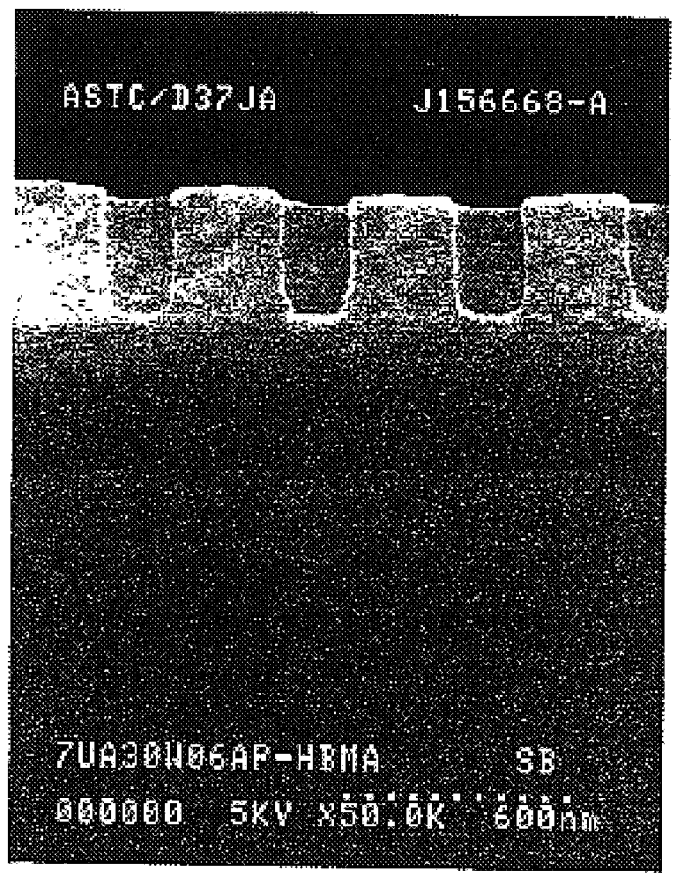
FIG. 2 shows a scanning electron microscope (SEM) picture of a prior art wafer stack comprising a DT level with a 193-nm resist layer on the substrate (the resist is sensitive to 193 nm laser, and its thickness is about 350-nm).

The footing resulting from the prior art wafer stack structure of the prior art of the FIG. 1 lithographic profile is shown in the scanning electron microscope (SEM) picture of FIG. 2, where the 193-nm resist layer is of a thickness of approximately 350 nm on the structure.

The hardmask in FIG. 1 is a bottom anti-reflective coating (BARC) having a thickness of about 200 nm.

The hardmask optical constants for FIG. 1 are defined as the index of refraction n and the extinction coefficient k. Generally speaking, the ARC-hardmask and resist may be modeled so as to find the optimum optical parameters (n and k values) of the ARC-hardmask layer as well as the optimum thickness. To obtain this end, a knowledge of the optical constants of the entire film structure is needed in order to compute the minimal reflectance at ARC-hardmask and resist interface. Computations are based on algorithms which use the Fresnel coefficients, as found in standard text books such as OPTICS, by Hecht and A. Zajak, 1979, Wiley, pgs. 312–313. The n value for the hardmask in FIG. 1 is n=2.1 and the k value for the hardmask in FIG. 1 is k=0.65 for 200 nm.

Figure 3:
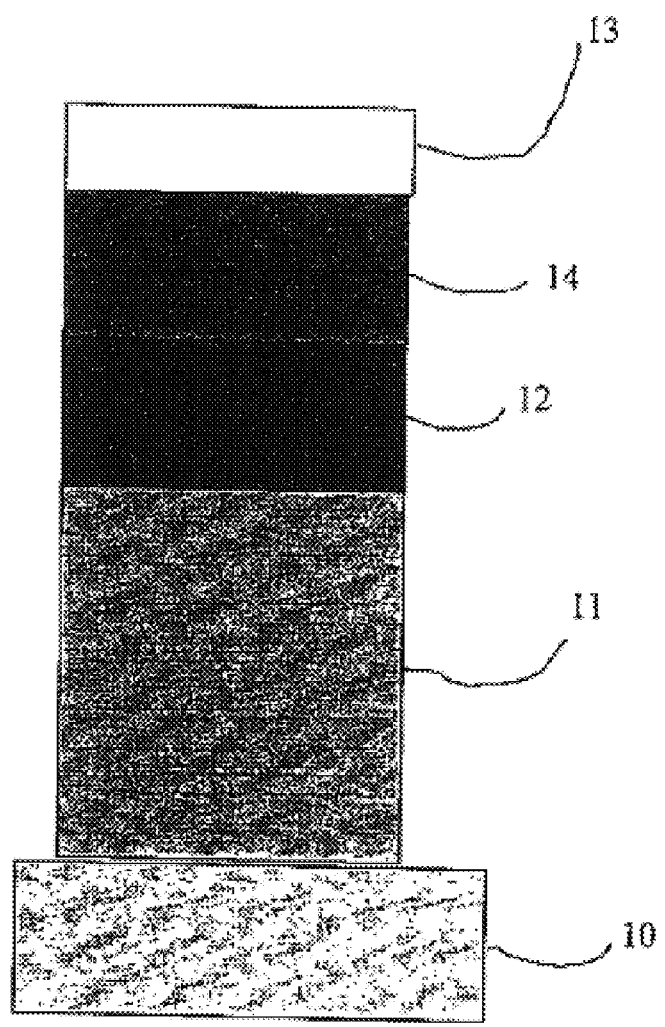
FIG. 3 depicts a wafer stack comprising a DT level formed by the method of the invention, which inserts a blocking layer of SiO₂ between the cap layer and the resist.

The wafer stack comprising a DT level formed by the method of the invention is depicted in FIG. 3, and shows the insertion of a blocking layer of SiO₂ 14 between the resist 13 and the cap layer 12, which is a tunable etch resistance ARC (TERA). The TERA layer is a vapor deposited SiO₂, and may function as an antireflective coating, hardmask or a combined antireflective coating/hardmask for high resolution lithography. The hardmask may be made of any suitable inorganic material such as silicon carbon oxide or alternatively the hardmask may be made of an organic material. By inserting the SiO₂ layer between the resist and TERA/cap layer, the interaction between TERA/cap layer and resist is blocked, and therefore prevents footing. The thickness of the TERA layer is 200 nm, while n=2.1 and k=0.65. The thickness of the cap layer is 25+/−10 nm, while n=1.8 and k=0.2. For the SiO₂ layer, n=1.56 and k=0. Suitable resist materials include 193 nm DUV resist and 248 nm DUV resist.

Figure 4:
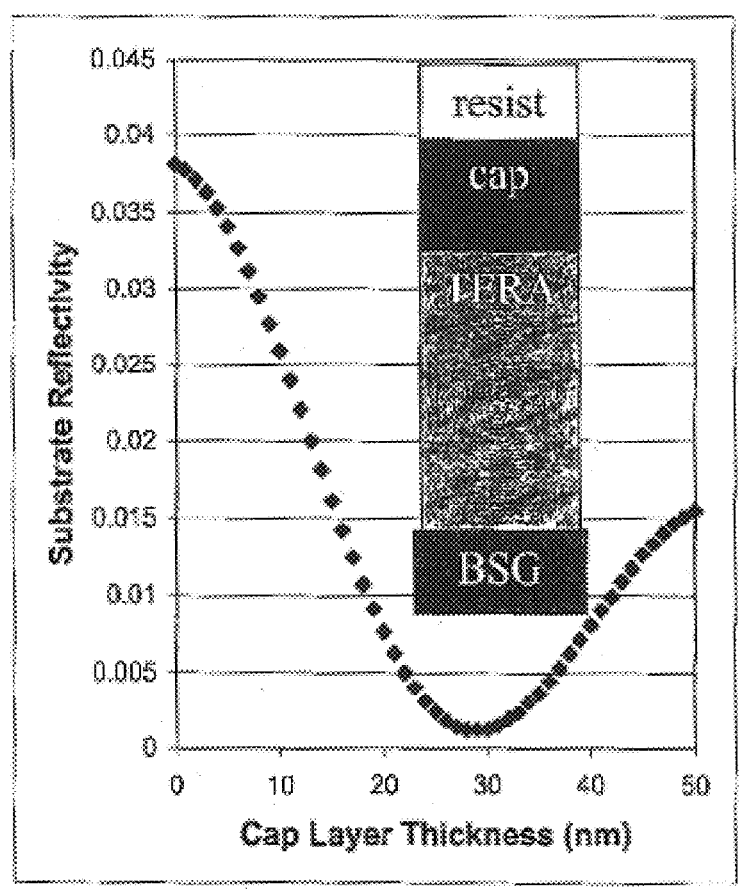
FIG. 4 shows substrate reflectivity as a function of the stack and is a graph of substrate reflectivity versus cap layer thickness for a prior art wafer stack comprising a DT level.

Substrate reflectivity as a function of the wafer stack of the prior art is shown in the graph of FIG. 4, which depicts substrate reflectivity versus cap layer thickness. As shown from this graph, if the cap layer thickness is controlled within 25+/−10 nm, preferably between 20 nm–35 nm, substrate reflectivity is ≦0.8%.

Figure 5:
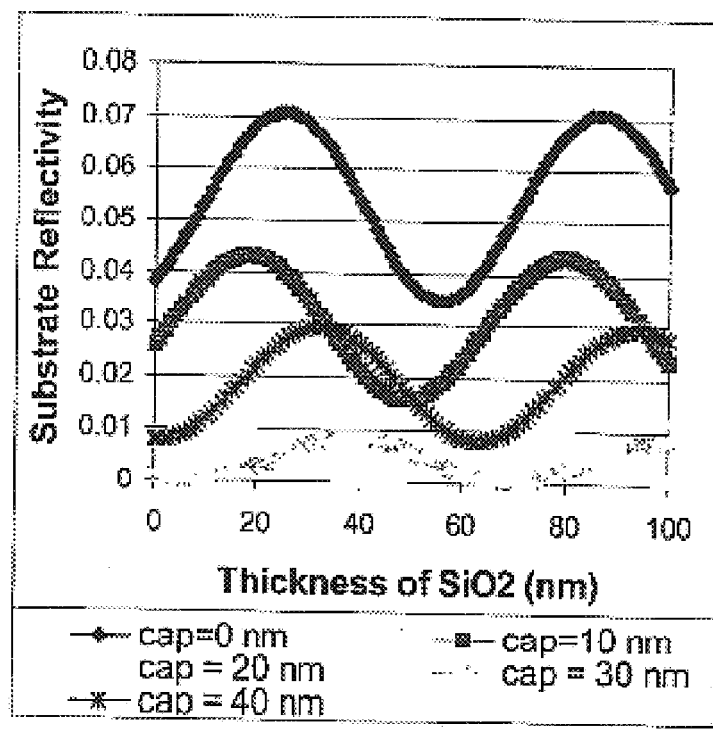
FIG. 5 shows substrate reflectivity as a function of the stack and is a graph of the substrate reflectivity versus the thickness of the inserted blocking layer of SiO₂, formed by the process of the present invention.

Substrate reflectivity as a function of the wafer stack prepared by the process of the invention (FIG. 3) is shown in FIG. 5, which depicts substrate reflectivity versus the thickness of SiO2.

Figure 6:
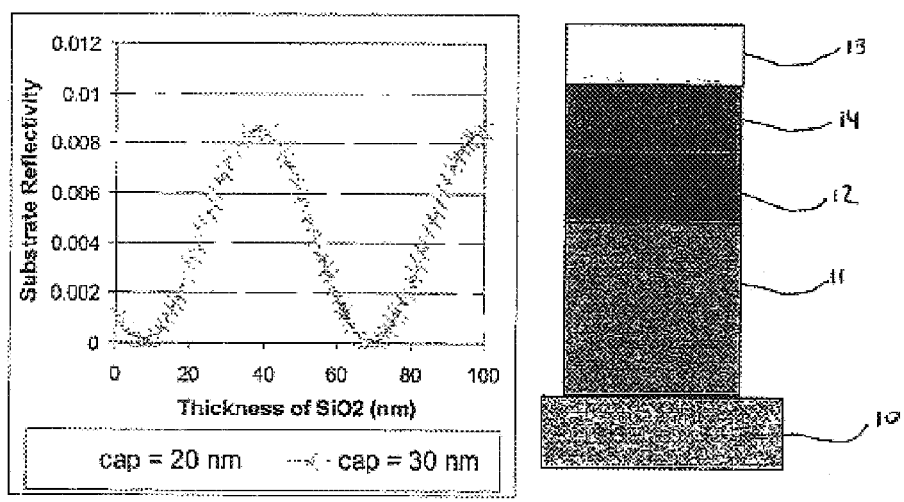
FIG. 6 shows substrate reflectivity as a function of the stack and is a graph showing substrate reflectivity versus SiO₂ thickness for a stack formed by the process of the invention in which the cap thickness is 25 nm+/−5 nm.

FIG. 6 pertains to substrate reflectivity as a function of the wafer stack of the invention process, where substrate reflectivity versus thickness of SiO₂ is depicted. When a cap thickness of 25 nm+/−5 nm is chosen, a SiO₂ layer may be utilized at a thickness ranging from slightly more than 0 to about 100 nm, preferably about 20 nm due to etching considerations.

Figure 7:
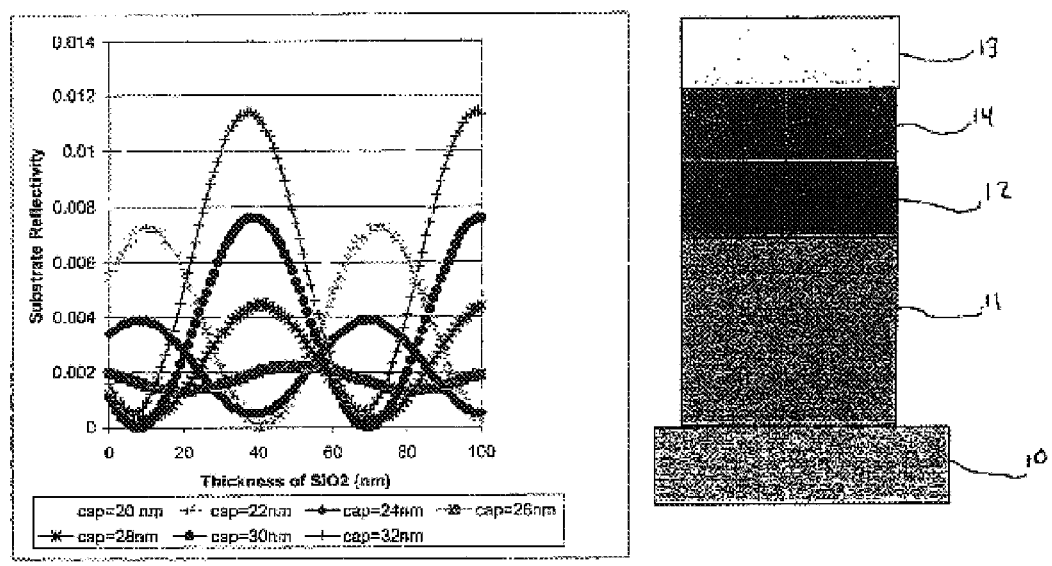
FIG. 7 shows a graph of substrate reflectivity versus SiO₂ thickness and a corollary wafer stack comprising a DT level for cap thicknesses varying from about 20 nm to about 32 nm, resulting from the process of the invention.

A graph of substrate reflectivity versus SiO₂ thickness is shown in FIG. 7 along with a corollary wafer stack comprising a DT level for cap thickness ranging from about 20 nm to about 32 nm, prepared by the process of the invention. Again, if a cap thickness of 25 nm+/−5 nm is chosen, an SiO₂ thickness can be chosen ranging from about slightly more than 0 to about 100 nm, preferably about 20 nm due to etch considerations.

Figure 8:
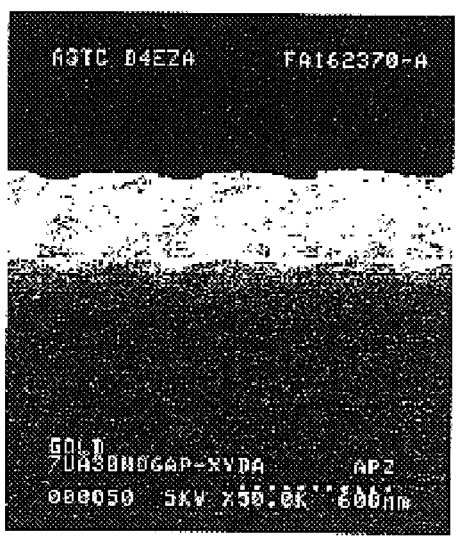
FIG. 8 is a cross-sectional view of a SEM picture of a wafer stack with DT level and SiO₂ cap, where the standing waves are caused by high substrate reflectivity, due to the fact that stack thickness is not optimized.

A cross-sectional view of a SEM picture of a wafer stack with DT level and a SiO₂ layer is shown in FIG. 8; however, the structure is characterized by standing waves, due to high substrate reflectivity in excess of 0.8 percent.

Although the invention has been described by way of specific embodiments, it is to be understood that the invention is not intended to be limited to this description, but instead only to the extent set forth in the following claims.

I claim:

1. A process of eliminating resist footing on a hardmask when preparing a semiconductor wafer stack, comprising:
   a) depositing a layer of BARC hardmask material on a substrate;
   b) subjecting the BARC hardmask to oxygen under conditions sufficient to produce an oxide cap layer and provide a hardmask/oxide cap layer with a substrate reflectivity below 0.8%;
   c) depositing a layer of SiO₂ directly onto the hardmask/ oxide cap layer, said layer of SiO₂ having a thickness of between 20 nm and about 32 nm;
   d) forming a layer of photoresist on the layer of SiO₂;
   e) patterning and developing the layer of photoresist by exposing photoresist; and f) etching exposed portions of the layer of hardmask/oxide cap layer/SiO$_2$ layer to obtain a semiconductor wafer stack with no standing waves and free from resist footing.

2. The process of claim 1 wherein said substrate is selected from the group consisting of tetraethylorthosilicate (TEOS) and borosilicate glass (BSG).

3. The process of claim 1 wherein said photoresist of step d) is a single layer resist (SLR).

4. The process of claim 3 wherein said hardmask material is inorganic.

5. The process of claim 3 wherein said hardmask is organic.

6. The process of claim 4 wherein said inorganic is silicon carbon oxide.

7. The process of claim 1 wherein said resist is a 193 nm DUV resist.

8. The process of claim 1 wherein said resist is a 248 nm DUV resist.

9. The process of claim 7 wherein, for said SiO$_2$ layer n=1.56 and k=0.

10. The process of claim 8 wherein, for said SiO$_2$ layer n=1.56 and k=0.

11. The process of claim 1 wherein for said cap layer n=1.8 and k=0.2.

12. The process of claim 11 wherein the hardmask has a thickness of about 200 nm.

13. The process of claim 1 wherein the hardmask has a thickness of about 200 nm.

14. The process of claim 12 wherein for said hardmask layer, n=2.1 and k=0.65.

15. The process of claim 13 wherein for said hardmask layer, n=2.1 and k=0.65.

16. A semiconductor wafer stack having a DT level and characterized by no standing waves, a substrate reflectivity below about 0.8%, and no resist footing, said stack comprising:

a substrate;

a BARC/hardmask deposited on said substrate;

an oxide cap layer formed on the top of said BARC/hardmask;

an SiO$_2$ blocking layer having a thickness of between about 20 nm and about 32 nm deposited directly onto the cap layer; and a patterned and developed resist layer.

17. The wafer stack of claim 16 wherein said resist layer is one of a 193 nm DUV resist and a 248 nm DUV resist.

18. The wafer stack of claim 16 wherein said BARC/hardmask has a thickness of about 200 nm.

19. The wafer stack of claim 16 wherein said BARC/hardmask is made of an inorganic material.

20. The wafer stack of claim 19 wherein said inorganic material is silicon carbon oxide.

21. The wafer stack of claim 16 wherein said BARC/hardmask is made of an organic material.

* * * * *